(12) United States Patent
Qian et al.

(10) Patent No.: US 9,054,330 B2
(45) Date of Patent: Jun. 9, 2015

(54) STABLE AND ALL SOLUTION PROCESSABLE QUANTUM DOT LIGHT-EMITTING DIODES

(75) Inventors: Lei Qian, Gainesville, FL (US); Ying Zheng, Gainesville, FL (US); Jiangeng Xue, Gainesville, FL (US); Paul H. Holloway, Gainesville, FL (US)

(73) Assignee: UNIVERSITY OF FLORIDA RESEARCH FOUNDATION, INC., Gainesville, FL (US)

(*) Notice: Subject to any disclaimer, the term of this patent is extended or adjusted under 35 U.S.C. 154(b) by 0 days.

(21) Appl. No.: 13/382,340

(22) PCT Filed: Jul. 7, 2010

(86) PCT No.: PCT/US2010/041208
§ 371 (c)(1),
(2), (4) Date: Feb. 10, 2012

(87) PCT Pub. No.: WO2011/005859
PCT Pub. Date: Jan. 13, 2011

(65) Prior Publication Data
US 2012/0138894 A1 Jun. 7, 2012

Related U.S. Application Data

(60) Provisional application No. 61/223,445, filed on Jul. 7, 2009.

(51) Int. Cl.
*H01L 51/50* (2006.01)
*H01L 51/52* (2006.01)

(52) U.S. Cl.
CPC .......... *H01L 51/502* (2013.01); *H01L 51/5048* (2013.01); *H01L 51/5206* (2013.01); *H01L 2251/5369* (2013.01)

(58) Field of Classification Search
CPC .......................... H01L 51/502; H01L 51/5048
USPC .............................. 257/13, E29.071; 438/962
See application file for complete search history.

(56) References Cited

U.S. PATENT DOCUMENTS

| 2004/0151944 A1* | 8/2004 | Onikubo et al. ............. 428/690 |
| 2004/0187917 A1* | 9/2004 | Pichler .......................... 136/263 |

(Continued)

FOREIGN PATENT DOCUMENTS

| EP | 1309013 | 5/2003 |
| WO | WO 2007-037882 | 4/2007 |

(Continued)

OTHER PUBLICATIONS

Caruge, J.M. et al., "Colloidal quantum-dot light-emitting diodes with metal-oxide charge transport layers," *Nature Photonics*, Apr. 2008, pp. 247-250, vol. 2.

(Continued)

*Primary Examiner* — Amar Movva
(74) *Attorney, Agent, or Firm* — Saliwanchik, Lloyd & Eisenschenk

(57) ABSTRACT

Embodiments of the invention are directed to quantum dot light emitting diodes (QD-LEDs) where the electron injection and transport layer comprises inorganic nanoparticles (I-NPs). The use of I-NPs results in an improved QD-LED over those having a conventional organic based electron injection and transport layer and does not require chemical reaction to form the inorganic layer. In one embodiment of the invention the hole injection and transport layer can be metal oxide nanoparticles (MO-NPs) which allows the entire device to have the stability of an all inorganic system and permit formation of the QD-LED by a series of relatively inexpensive steps involving deposition of suspensions of nanoparticles and removing the suspending vehicle.

23 Claims, 5 Drawing Sheets

(56) References Cited

U.S. PATENT DOCUMENTS

2006/0105200 A1    5/2006   Poplavskyy et al.
2008/0093608 A1*   4/2008   Chik et al. .................. 257/89
2009/0039764 A1    2/2009   Cho et al.
2010/0308369 A1*  12/2010   Gleason et al. ............. 257/103

FOREIGN PATENT DOCUMENTS

| WO | WO 2008-073373        | 6/2008  |
| WO | WO 2008073373 A1 *    | 6/2008  |
| WO | WO 2008-108798        | 9/2008  |
| WO | WO 2009-123763        | 10/2009 |
| WO | WO 2009123763 A2 *    | 10/2009 |

OTHER PUBLICATIONS

Caruge, J-M. et al., "NiO as an Inorganic Hole-Transporting Layer in Quantum-Dot Light-Emitting Devices," *Nano Letters*, 2006, pp. 2991-2994, vol. 6, No. 12.

Stouwdam, J.W. et al. "Red, green, and blue quantum dot LEDs with solution processable ZnO nanocrystal electron injection layers," *Journal of Materials Chemistry*, Mar. 5, 2008, pp. 1889-1894, vol. 18.

Pearton, S.J. et al., "Recent progress in processing and properties of ZnO," *Progress in Materials Science*, 2005, pp. 293-340, vol. 50.

Qian, L. et al., "Electroluminescence from light-emitting polymer/ZnO nanoparticle heterojunctions at sub-bandgap voltages," *Nano Today*, 2010, pp. 384-389, vol. 5.

\* cited by examiner

STABLE AND ALL SOLUTION PROCESSABLE QUANTUM DOT LIGHT-EMITTING DIODES

CROSS-REFERENCE TO RELATED APPLICATIONS

This application is the U.S. national stage application of International Patent Application No. PCT/US2010/041208, filed Jul. 7, 2010, which claims the benefit of U.S. Provisional Application Serial No. 61/223,445, filed Jul. 7, 2009, the disclosures of which are hereby incorporated by reference in their entireties, including any figures, tables, or drawings.

The subject invention was made with government support under a research project supported by ARO, Grant No. W911NF-07-1-0545 and DOE, Grant No. DE-FC26-06NT42855. The government has certain rights to this invention.

BACKGROUND OF INVENTION

Light emitting diodes (LEDs) are increasingly used in modern display technologies. LEDs have many advantages over traditional light sources including: low energy consumption, long lifetime, robustness, small size and fast switching. LEDs remain relatively expensive and require precise current and heat management relative to traditional light sources. Fabrication costs are significant and exceed the material costs for some LEDs. Conventional LEDs are made from inorganic compound semiconductors, typically AlGaAs (red), AlGaInP (orange-yellow-green), and AlGaInN (green-blue), which emit monochromatic light of a frequency corresponding to the band gap of the semiconductor compound used. These conventional LEDs do not emit light of mixed colors, for example white light. White LEDs can be used as light sources and are capable of producing full color displays with existing color filter technology. One method being used to produce white light is to combine individual LEDs to simultaneously emit the three primary colors, which mix to produce white light. Another method is to use a yellow phosphor to convert monochromatic blue light, or two or more phosphors emitting different colors to convert UV light, from a LED to broad-spectrum white light, although color control is limited by this approach. Organic LEDs (OLEDs) can also be fabricated relatively inexpensively to provide a variety of colors and white light, but OLEDs generally suffer from deficiencies in efficiency and in lifetime relative to inorganic devices as the light-emitting layer, being that of an organic material, typically requires a relatively high current density and driving voltage to achieve high luminance which promotes degradation of the OLEDs, especially in the presence of oxygen, water and UV photons.

Quantum dot light emitting diodes (QD-LEDs) are being developed for display and lighting sources. Inorganic quantum dot light emitters have a few advantages over OLEDs and other light-emitting diodes, which include stability, solution processability and excellent color purity. Quantum dots (QDs) are semiconductor nanocrystallites whose radii are smaller than the bulk exciton Bohr radius. Quantum confinement of electrons and holes in all three dimensions leads to an increase in the effective band gap of the QDs with decreasing crystallite size, where the optical absorption and emission of quantum dots shift to higher energies (blue shift) as the size of the dots decreases. For example, a CdSe QD can emit light in any monochromatic visible color depending only on the size of the QD and can be used to form QD-LEDs arrays that emit white light.

Current QD-LEDs employ a few layers of organic materials and reactive metals for efficient charge transport and injection. The use of the organics offsets some advantages of QD-LEDs and has discouraged commercialization of QD-LEDs. For instance, Sun et al., *Nature Photonics*, 2007, 1, 717 discloses tris(8-hydroxquinoline) aluminum (Alq3) as an electron transporting layer and calcium as an electron injection layer to obtain an efficient color QD-LED. Unfortunately, long term stability is insufficient due to degradation of the organic layer and oxidation of the reactive metal. Device fabrication requires a costly vacuum deposition method. For most QD-LEDs, defects can occur at the organic-inorganic interface between the QD-emitting layer and an organic electron transport layer, which lead to poor electron injection into the QD-emitting layer. Caruge et al., *Nature Photonics*, 2008, 2, 247 discloses a fully inorganic QD-LED with good long term stability. However, the charge transporting layers are fabricated through complicated and costly vacuum sputter deposition methods.

Cho et al., U.S. Patent Application Publication 20090039764 discloses a QD-LED where a continuous inorganic thin film is used to constitute the electron transport layer instead of an organic thin film. The inorganic thin film can be prepared by a cost effective solution coating process such as spin coating, printing, casting and spraying, followed by a chemical reaction, a sol-gel process, to form the inorganic thin film material after deposition on the light emitting layer. Preparation of all inorganic QD-LEDs or at least a device with an inorganic electron transport layer that does not require expensive processing steps or formation of a layer by a reaction process is desirable.

BRIEF SUMMARY

Embodiments of the invention are directed to quantum dot light emitting diode (QD-LED) that include a light emitting layer having a plurality of quantum dots (QDs) and an electron injection and transport layer having a plurality of inorganic nanoparticles (I-NPs). The QDs can be: Group II-VI compound semiconductor nanocrystals such as CdS, CdSe, CdTe, ZnS, ZnSe, ZnTe, HgS, HgSe, HgTe or any combination thereof; Group III-V or IV-VI compound semiconductor nanocrystals such as GaP, GaAs, GaSb, InP, InAs and InSb; PbS, PbSe, PbTe or any combination thereof; CuInSe$_2$ nanocrystals; metal oxide nanoparticles such as ZnO, TiO$_2$, or a combination thereof; core-shell structured nanocrystals such as CdSe/ZnSe, CdSe/ZnS, CdS/ZnSe, CdS/ZnS, ZnSe/ZnS, InP/ZnS ZnO/MgO, or any combination thereof The semiconductor nanoparticle may be either undoped or doped with rare earth element such as Eu, Er, Tb, Tm, Dy or any combination thereof, or doped with transition metal elements such as Mn, Cu, Ag or any combination thereof. The I-NPs can be: undoped ZnO; ZnO doped with Al, Cd, Cs, Cu, Ga, Gd, Ge, In, Li and/or Mg; TiO$_2$; SnO$_2$; WO$_3$; Ta$_2$O$_3$; CdS; ZnSe; ZnS; or any combination thereof. The I-NPs have a mean characteristic diameter of less than approximately 20 nm and can have a characteristic diameter of less than 5 nm. The QD-LEDs can also include a hole injection and transport layer that includes a plurality of metal oxide nanoparticles (MO-NPs), such as NiO, MoO$_3$, MoS$_2$, Cr$_2$O$_3$ and Bi$_2$O$_3$, p-type ZnO, p-type GaN, or any combination thereof.

Other embodiments of the invention are directed to methods of preparing the above QD-LED that involve providing an electrode, depositing an electron injection and transport layer comprising I-NPs, depositing a light emitting layer comprising a plurality of QDs, depositing a hole injection and transport layer, and capping the QD-LED with a counter electrode.

Each step of depositing involves a non-reactive fluid deposition method. Deposition of the electron injection and transport layer can be carried out by spin coating, printing, casting, or spraying a surface of the electrode or the light emitting layer with a suspension of I-NPs followed by removing any suspending vehicle from the deposited suspension. Depositing the hole injection and transport layer can be carried out by spin coating, printing, casting, or spraying a surface of the electrode or the light emitting layer with a suspension of MO-NPs and removing any suspending vehicle from the deposited suspension. Depositing the hole injection and transport layer can be carried out by spin coating, printing, casting, or spraying a surface of the electrode or the light emitting layer with a solution of one or more inorganic materials and removing a solvent from said deposited solution of inorganic materials. Alternately, the deposition of the hole injection and transport layer can involve chemical vapor deposition, sputtering, e-beam evaporation or vacuum deposition. In an embodiment of the method every deposition step can involve spin coating, printing, casting, or spraying a solution or suspension and subsequently removing a solvent or suspending vehicle from the deposited solution or suspension.

DETAILED DESCRIPTION

Embodiments of the invention are directed to quantum dot light emitting diodes (QD-LEDs) where the electron transport layer comprises a nanoparticulate inorganic material. In some embodiments of the invention the hole transport layer also comprises a nanoparticulate inorganic material. The novel QD-LEDs overcomes shortcomings of current QD-LED with regard to device stability.

Embodiments of the invention are directed to a method of fabricating the novel QD-LEDs employing fluid processes that do not require a reaction step after the deposition of the nanoparticle layers. The novel process reduces the fabrication costs relative to other methods, such as vapor deposition, and allows fabrication free from the variability that can occur with reaction processes due to inconsistencies of temperature, pressure, stoichiometry, catalysis levels, or reactive impurities when the material is formed simultaneously with the layer.

Figure 1:
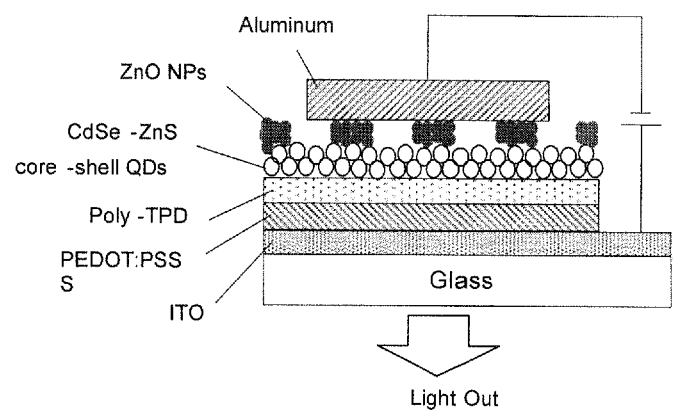
FIG. 1 shows a schematic of the structure of a QD-LED with a nanoparticulate electron injection layer according to an embodiment of the invention.

FIG. 1 shows a QD-LED structure according to an embodiment of the invention using a discontinuous layer of ZnO nanoparticles (NPs) as the electron injection and transport layer. The electrons are received from an Al cathode and injected from this ZnO NPs layer into the QD light emitting layer, shown in the illustrated embodiment as CdSe-ZnS core-shell NPs. In this embodiment the hole injection and transport layer is shown as poly [N,N-bis(4-butylphenyl)-N, N-bis(phenyl)benzidine] (Poly-TPD) on a poly(ethylene-dioxythiophene): polystyrene sulfinate PEDOT:PSS on a indium-tin-oxide (ITO) glass anode supported on a glass substrate. The core-shell NP CdSe-ZnS light emitting layer can be provided as a multiplicity of monodispersed single sized NPs. For example, CdSe-ZnS NPs of three different sized NPs emitting at three different colors can form LEDs that can be combined to emit white light.

Figure 2:
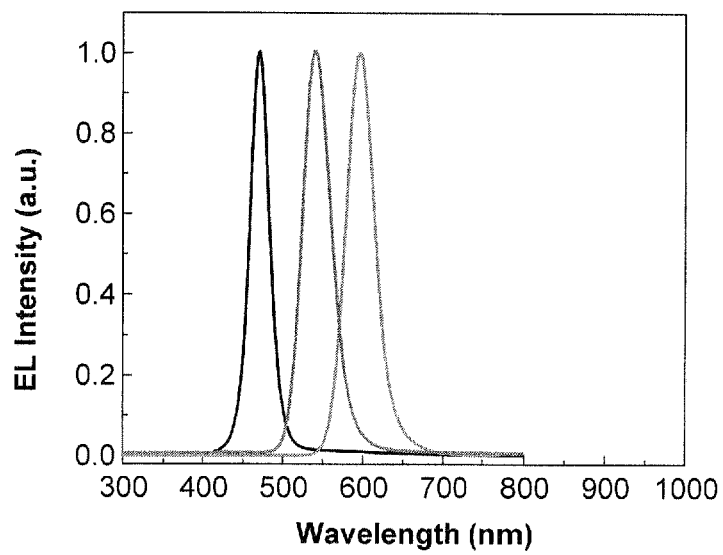
FIG. 2 shows the electroluminescence spectra for individual green, blue, and orange QD-LED of the design of FIG. 1 according to embodiments of the invention.

FIG. 2 shows the electroluminescence spectra of three colored QD-LEDs constructed as illustrated in FIG. 1, with appropriate QDs to displays emission of three different colors: blue, green and orange having narrow shape with a full width at half maximum (FWHM) of 20-40 nm. The QD-LED maximum luminance and external quantum efficiency observed for the three wavelengths of the QD-LED are 2,248 cd/m$^2$, 0.17% for blue; 68,139 cd/m$^2$, 1.83% for green; 9,440 cd/m$^2$, 0.65% for orange, as shown in FIG. 3.

Figure 3:
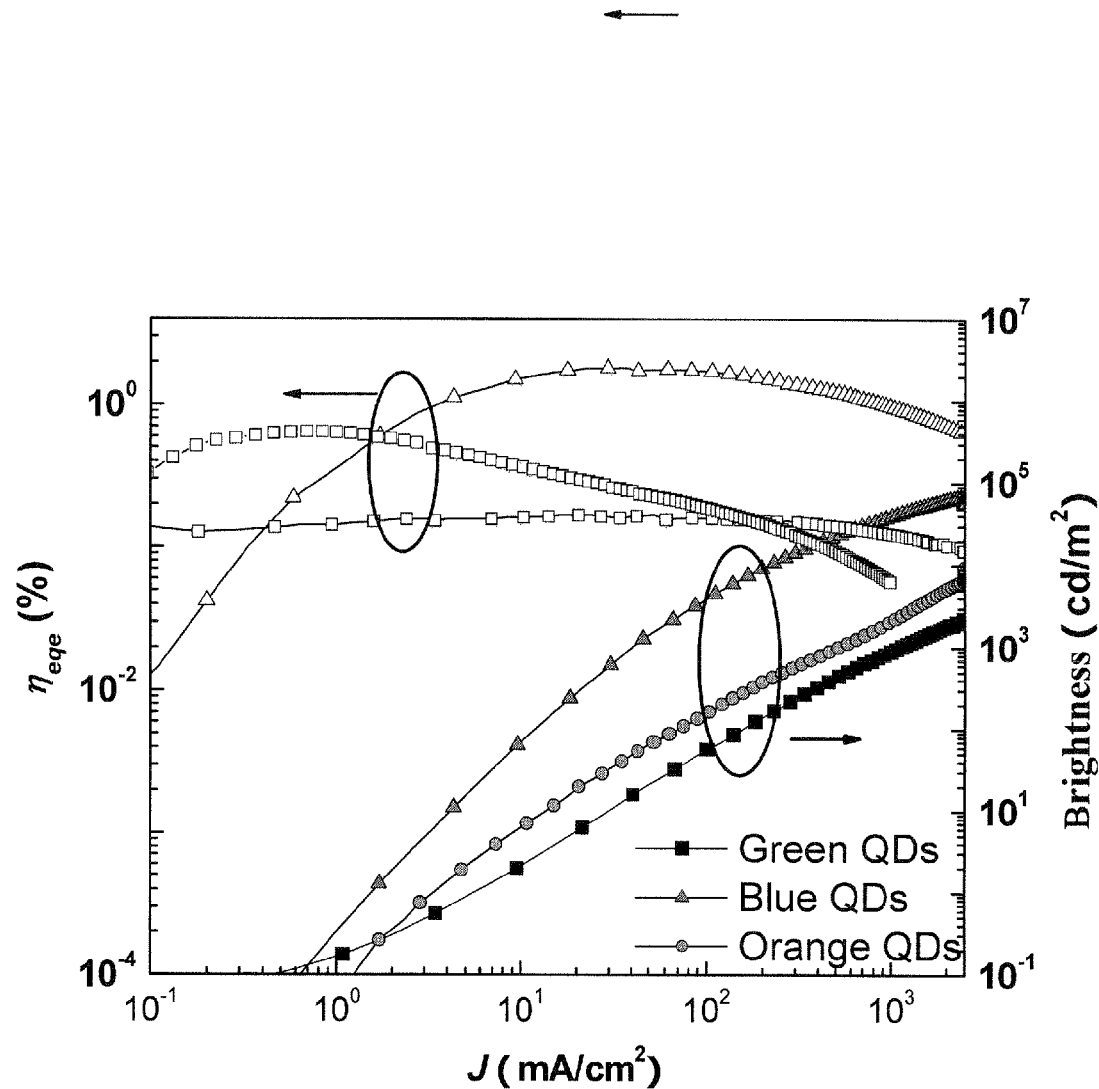
FIG. 3 shows plots of the brightness (right axis) and external quantum efficiency (left axis) versus current density for the green (triangles), blue (squares), and orange (circles) QD-LED of FIG. 2 according to embodiments of the invention.

For the experimental devices of FIG. 3, all active layers of the QD-LEDs, composed of organic or inorganic materials, can be deposited using fluid processing. The brightness of the green ZnO based device increased from 300 cd/m$^2$ to 600 cd/m$^2$ after continuously operating at 40 mA/cm$^2$ in a glove box without encapsulation of the device. Such a time-dependent brightening effect has been observed in studies of the photoluminescence from these QDs, and suggests that this phenomenon may result from a surface passivation process.

Figure 4:
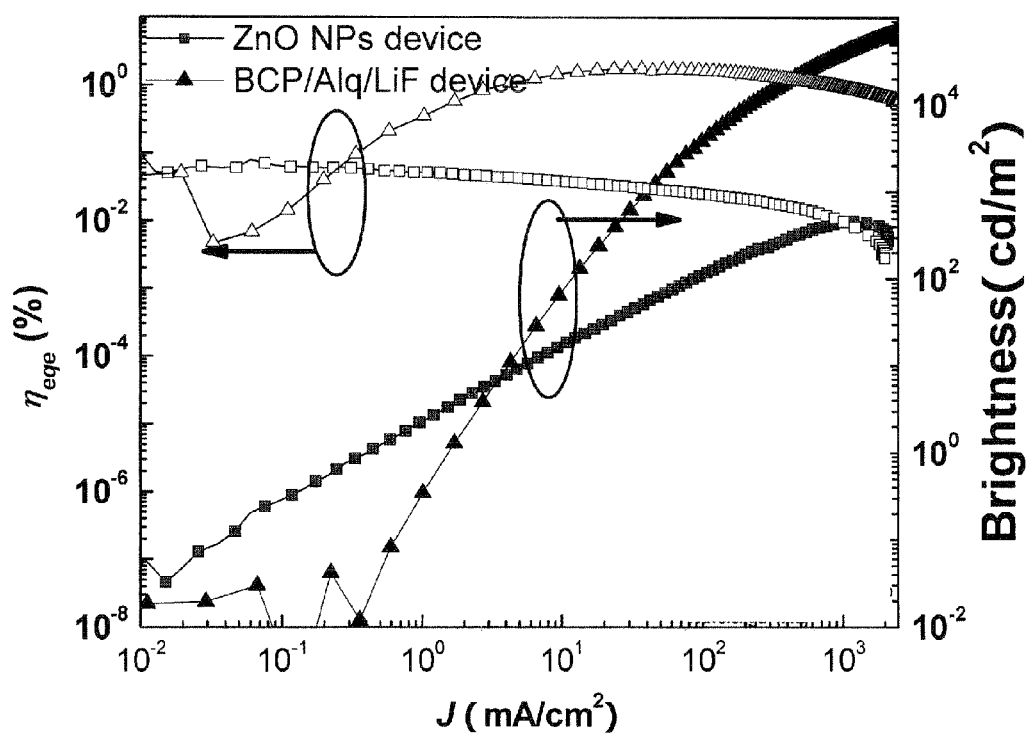
FIG. 4 shows a comparison plot of the brightness (right axis) and external quantum efficiency (left axis) versus current density for a green QD-LED with ZnO NPs as electron transport (triangles) according to an embodiment of the invention and a conventional green QD-LED with BCP/Alq3/LiF as electron transport layer (squares).
Figure 5:
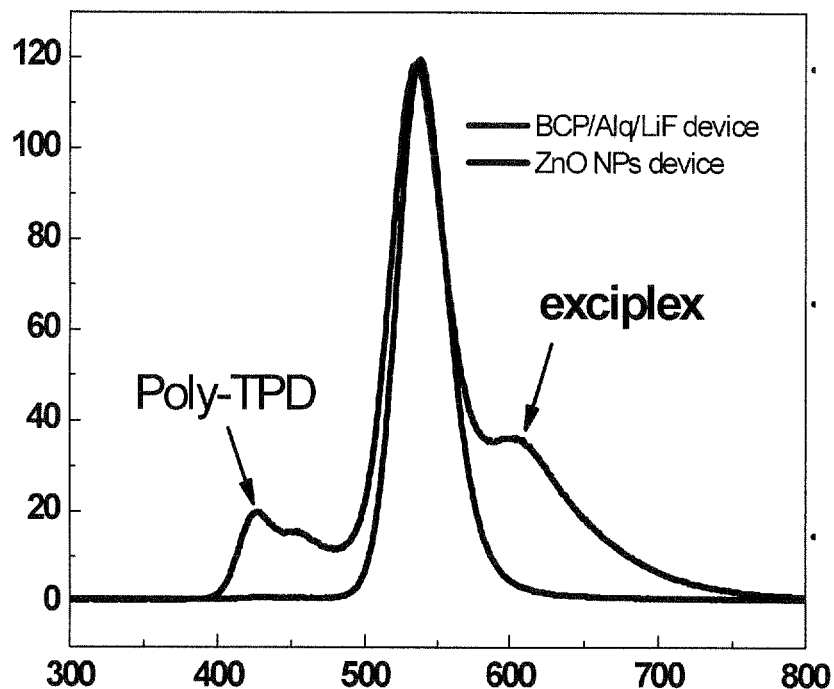
FIG. 5 shows superimposed electroluminescence spectra of the two QD-LEDs of FIG. 4.

For experimental green and orange QD-LED devices according to embodiments of the invention, maximum luminous values and external quantum efficiency values exceed those reported for a conventional QD-LED. The conventional QD-LED, has the structure (2,9-Dimethyl-4,7-di-phenyl-1, 10-phenanthroline)/(tris(8-hydroxy-quinolate)aluminum)/ lithium fluoride (BCP/Alq3/LiF) structure as hole blocking and electron injection/transport layers that are deposited in sequence using vacuum thermal evaporation. In contrast, the novel ZnO NPs electron injection and transport layer of the present invention are deposited using a spin-coating technique. It can be seen in FIG. 4 that the ZnO based green device shows an order of magnitude higher efficiency than the conventional device, and, as illustrated in FIG. 5, the color purity is also superior. The more than 10 times enhancement for a nanoparticulate ZnO based device compared to a conventional device is due to efficient electron injection and transport by the nanoparticulate ZnO layer.

Figure 6:
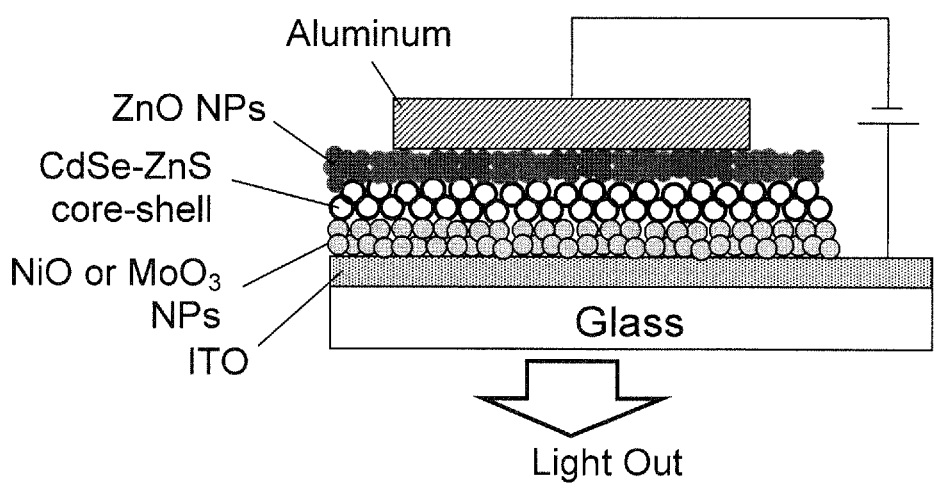
FIG. 6 shows a schematic of the structure of an all inorganic QD-LED (QD-ILED) with a nanoparticulate electron transport layer and a nanoparticulate hole transport layer according to an embodiment of the invention.
Figure 7:
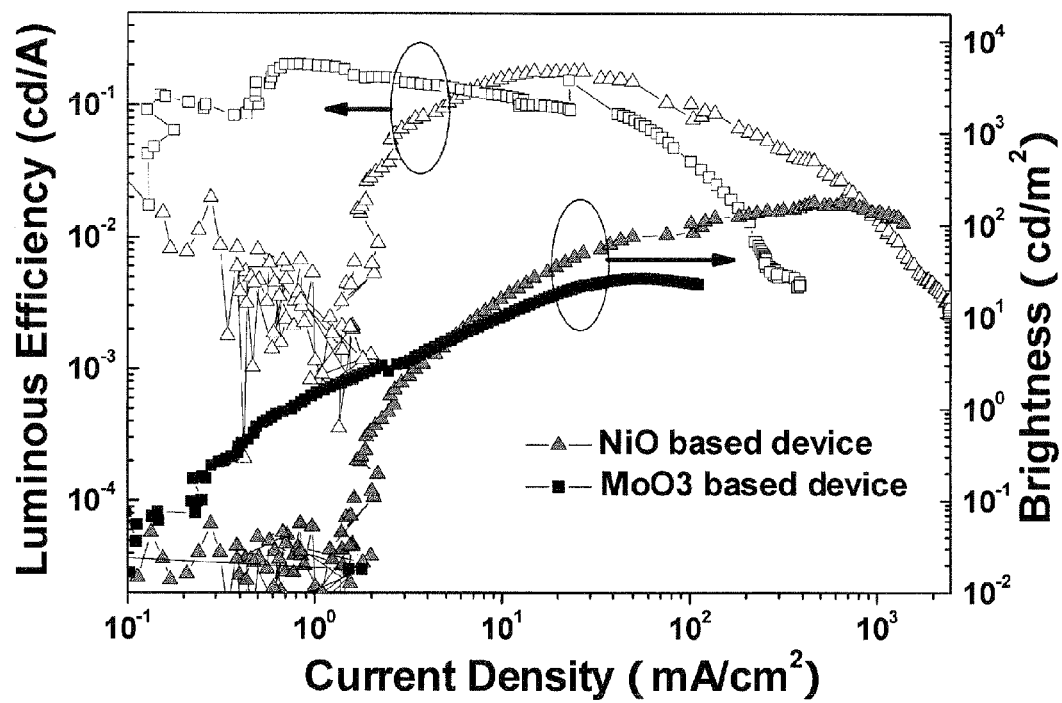
FIG. 7 shows a plot of the brightness (right axis) and luminous efficiency (left axis) versus current density for inorganic nanoparticle QD-ILEDs where the hole transport layer is NiO (triangles) and MoO$_3$ (squares) according to embodiments of the invention.

An QD-inorganic light emitting diode (QD-ILED) that is fully fluid processable is illustrated in FIG. 6, where the electron injection and transport layer is composed of ZnO NPs and the hole injection and transport layer is composed of either NiO or MoO$_3$ NPs. FIG. 7 shows the luminance-voltage characteristics of experimental NiO and MoO$_3$ based devices, where maximum brightness values of 180 cd/m$^2$ and 26 cd/m$^2$ are achieved, respectively. The peak current efficiency of the two QD-ILEDs are similar, at about 0.2 cd/A, as shown in FIG. 7.

The anode can be formed on a transparent substrate which can be glass or even a polymer. The anodes can be, but is not limited to doped or undoped oxides including indium tin oxide (ITO), indium zinc oxide (IZO), indium copper oxide (ICO), Cd:ZnO, SnO$_2$, In$_2$O$_3$, F:SnO$_2$, In:SnO$_2$, Ga:ZnO, and Al:ZnO but can be metallic layers including nickel (Ni), platinum (Pt), gold (Au), silver (Ag), and iridium (Ir) or mixed carbon nanotubes. The anode can be a continuous film or it can be constructed of micro or nanowires which can be distributed in a patterned or random manner.

The hole injection and transport layer can be deposited on the anode or the QD light emitting layer by a fluid based method such as spin coating, printing, casting and spraying a solution or suspension of the material followed by removal of the suspending vehicle, generally an organic liquid, water, or a mixture of liquids that can be evaporated or otherwise removed from the material to be deposited to form the layer. For devices as illustrated in FIG. 1, the material deposited can be, but is not limited to, an organic polymer comprising poly(3,4-ethylenedioxythiophene) (PEDOT:PSS), poly-N-vinylcarbazole, polyphenylene-vinylene, polyparaphenylene, polymethacrylate derivatives, poly(9,9-octylfluorene), poly(spiro-fluorene), TPD, NPB, tris(3-methylphenylphenylamino) triphenylamine (m-MTDATA), poly(9,9'-dioctylfluorene-co-N-(4-butylphenyl) diphenylamine (TFB), poly[2-methoxy-5-(2'-ethylhexyloxy)-1,4-phenylene vinylene] (MEH-PPV) and poly[2-methoxy-5-(3', 7'-dimethyloctyloxy)-1,4-phenylene vinylene] (MDMO-PPV) or any of the above mentioned polymer doped with tetrafluoro-tetracyanoquinodimethane (F4-TCNQ). The thickness of the hole transport layer can be about 10 nm to about 200 nm.

The novel particulate hole transport layer of the devices illustrated in FIG. 6 can be a nanoparticulate metal oxide (MO-NPs) such as, but not limited to, NiO, MoO$_3$, Cr$_2$O$_3$, Bi$_2$O$_3$, or p-type ZnO, a non-oxide equivalent such as MoS$_2$ or p-type GaN, or any combination thereof. The nanoparticulate hole transport layer can be 10 nm to about 100 nm and can be deposited on the anode or QD light emitting layer by a fluid based method such as spin coating, printing, casting and spraying of a suspension of the nanoparticles on the anode or light-emitting layer and subsequently removing a liquid suspending vehicle, such as an organic liquid, water, or a combination of liquids by evaporation or other means to form the nanoparticulate layer.

The QD light-emitting layer can be selected from the group consisting of: Group II-VI compound semiconductor nanocrystals, such as CdS, CdSe, CdTe, ZnS, ZnSe, ZnTe, HgS, HgSe and HgTe; Group III-V or IV-VI compound semiconductor nanocrystals, such as GaP, GaAs, GaSb, InP, InAs and InSb; PbS, PbSe, and PbTe; CuInSe$_2$; metal oxide nanoparticles such as ZnO, TiO$_2$; or a core-shell structured nanocrystals such as CdSe/ZnSe, CdSe/ZnS, CdS/ZnSe, CdS/ZnS, ZnSe/ZnS, InP/ZnS and ZnO/MgO; the semiconductor nanocrystals can be undoped or doped with rare earth elements, such as Eu, Er, Tb, Tm, and/or Dy, and/or doped with transition metal elements Mn, Cu, Ag; or any combination thereof. The quantum dot light-emitting layer preferably has a thickness of about 5 nm to about 25 nm and can be deposited on either the hole or electron transport layers by a fluid based method such as spin coating, printing, casting and spraying of a suspension of the QDs and removing a liquid suspending vehicle to form the QD light-emitting layer.

The novel particulate electron injection and transport layer are inorganic nanoparticles (I-NPs) that can include, but are not limited to ZnO undoped or doped with Al, Cd, Cs, Cu, Ga, Gd, Ge, In, Li and/or Mg with dopant concentration from 0.001% to 99.999% by weight, TiO$_2$, SnO$_2$, WO$_3$, Ta$_2$O$_3$, CdS, ZnSe, ZnS, or any combination thereof. The nanoparticles in this layer have a mean characteristic diameter of less than approximately 20 nm, and preferably less than 5 nm. The layer can have a thickness of less than 5 nm to about 200 nm and can be formed on the cathode or QD light emitting layer by a method such as spin coating, printing, casting and spraying of a suspension of the I-NPs followed by removal of the suspending vehicle leave the particulate electron injection and transport layer. The suspending vehicle can be an organic liquid, water, or a combination of liquids.

The cathodes according to embodiments of the invention can be ITO, Ca, Ba, Ca/Al, LiF/Ca, LiF/Al, BaF$_2$/Al, BaF$_2$/Ca/Al, Al, Mg, CsF/Al, CsCO$_3$/Al, Au:Mg or Ag:Mg. The film can range in thickness from about 50 nm to about 300 nm.

In summary, both QD-LED device structures have the distinct advantage of being all solution processable, which significantly reduces the fabrication cost of QD-LED. Moreover, partial or complete removal of the organic layer will lead to longer lifetime. Further optimization of the above two type of device structure should result in even better performance.

Methods and Materials

Nanoparticles of metal oxides, such as ZnO. NiO and MoO$_3$, can be synthesized by a number of techniques including hot solutions, colloidal solutions, or sol-gel methods. In a typical sol gel process for ZnO, nanoparticles were synthesized by dropwise addition of a stoichiometric amount of tetramethylammonium hydroxide dissolved in ethanol (0.55M) to 30 mL of 0.1M zinc acetate dihydrate dissolved in DMSO followed by stirring for an hour at room temperature. After washing multiple times in heptane/ethanol with a 1:3 volume ratio, ZnO nanoparticles were dispersed in pure ethanol.

Quantum dots for the active layer of the QLED may be synthesized by a number of techniques including hot solutions or colloidal solutions methods. In a typical hot solutions synthesis of CdSe/ZnS quantum dots having an emission peak at 524 nm (green), 0.1 mmol of CdO and 4 mmol of zinc acetate were mixed with 5 mL of oleic acid in a 50 mL flask, heated to 150° C., and degassed for 30 min. Subsequently, 15 mL of 1-octadecene was injected into the reaction flask and heated to 300° C. while the reaction vessel was maintained under pure, dry nitrogen. At a temperature of 300° C., 0.2 mmol of Se and 3 mmol of S dissolved in 2 mL of trioctylphosphine was swiftly injected into the vessel. After 10 min, 0.5 mL of 1-octanethiol was introduced into the reactor to passivate the quantum dots, and the temperature of the reactor was lowered to room temperature. After purification, the resulting CdSe/ZnS quantum dots were dispersed in toluene.

Typical fabrication process for QD-LED with a device structure of ITO/PEDOT:PSS/poly[-bis(4-butylphenyl)-bis(phenyl) benzidine] (poly-TPD)/quantum dot emitting layer/doped or undoped ZnO nanoparticle layer/Al may be fabricated in the following manner. A glass substrate with an ITO transparent electrode was cleaned sequentially with de-ionized water, acetone and isopropanol followed by an UV-ozone treatment. The PEDOT:PSS (Baytron AI 4083) was spin-coated on top of the ITO layer followed by baking at 150° C. in air. The poly-TPD was spin-coated at 2000 rpm onto the PEDOT:PSS layer from a chlorobenzene solution and annealed at 110° C. in nitrogen for 30 min. The quantum dot emitting layer was deposited onto the poly-TPD layer with spin-coating at various rates between 500 and 6000 rpm from a toluene solution with concentrations between 5 and 20 mg/ml. The doped or undoped ZnO nanoparticles were dispersed in ethanol and spin-coated at 4000 rpm onto the quantum dot layer to provide a 40 nm thick layer. The assembled device was then annealed at 60° C. in nitrogen for 30 minutes before loading into a vacuum chamber for Al cathode deposition.

A typical QD-ILED with a structure of ITO/MoO$_3$ or NiO nanoparticle layer/quantum dot emitting layer/doped or undoped ZnO nanoparticle layer/Al was fabricated as follows. A glass substrate with an ITO layer was prepared in the same fashion as for the QD-LED mentioned above, followed by spin-coating of a MoO$_3$ or NiO nanoparticle layer onto the ITO layer at various rates between 500 and 4000 rpm from an ethanol solution with concentrations between 10 and 50 mg/ml. The partially assembled device was annealed at a temperature between room temperature and 500° C. for 30 min in air before subsequent deposition of the quantum dot/ZnO nanoparticles/Al layers in the manner indicated above.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed is:

1. A quantum dot light emitting diode (QD-LED), comprising:
   a light emitting layer comprising a plurality of quantum dots (QDs); and
   a particulate electron injection and transport layer consisting of a plurality of ZnO nanoparticles wherein the ZnO nanoparticies have a diameter less than 5 nm.

2. The QD-LED of claim 1, wherein said QDs comprise: Group II-VI compound semiconductor nanocrystals; Group III-V or IV-VI compound semiconductor nanocrystals; CuInSe$_2$ nanocrystals; metal oxide nanoparticles; core-shell structured nanocrystals; said semiconductor nanocrystals doped with rare earth elements or transition metal elements; or any combination thereof.

3. The QD-LED of claim 2, wherein said Group II-VI compound semiconductor nanocrystals comprises CdS, CdSe, CdTe, ZnS, ZnSe, ZnTe, HgS, HgSe, HgTe, CdSTe, or any combination thereof.

4. The QD-LED of claim 2, wherein said Group III-V or IV-VI compound semiconductor nanocrystals comprises GaP, GaAs, GaSb, InP InAs and InSb; PbS, PbSe, PbTe or any combination thereof.

5. The QD-LED of claim 2, wherein said core-shell structured nanocrystals comprise CdSe/ZnSe, CdSe/ZnS, CdS/ZnSe, CdS/ZnS, ZnSe/ZnS,InP/ZnS ZnO/MgO, or any combination thereof.

6. The QD-LED of claim 2, wherein said semiconductor nanocrystals doped with rare earth elements comprise Eu, Er, Tb, Tm, Dy or any combination thereof.

7. The QD-LED of claim 1, wherein said QDs have a mean characteristic diameter of less than 5 nm.

8. The QD-LED of claim 1, further comprising a low work function electrode and a transparent high work function electrode.

9. The QD-LED of claim 8, further comprising a hole injection and transport layer comprising a plurality of metal oxide nanoparticles (MO-NPs).

10. The QD-LED of claim 9, wherein said MO-NPs comprises NiO, MoO$_3$, MoS$_2$, Cr$_2$O$_3$ and Bi$_2$O$_3$, p-type ZnO, p-type GaN, or any combination thereof.

11. The QD-LED of claim 9, wherein said electron injection and transport layer is between said low work function electrode and said light emitting layer and said hole injection and transport layer is between said light emitting layer and said transparent high work function electrode.

12. The QD-LED of claim 9, wherein said electron injection and transport layer is between said high work function transparent electrode and said light emitting layer and said hole injection and transport layer is between said light emitting layer and said low work function electrode.

13. The QD-LED of claim 8, wherein said low work function electrode comprises: aluminum; magnesium; calcium; barium; or a thin layer of LiF, CsF, or Cs$_2$CO$_3$ covered with aluminum.

14. The QD-LED of claim 8, wherein said transparent high work function electrode comprises poly(3,4-ethylenedioxylenethiophene):polystyrene sulfonic acid (PEDOT:PSS) or polythienothiophene (PTT) doped with poly(perfluoroethylene-perfluoroethersulfonic acid) (PFFSA) on indium-tin-oxide (ITO).

15. The QD-LED of claim 8, wherein said transparent high work function electrode comprises indium-tin-oxide (ITO), indium-zinc-oxide (IZO), zinc-tin-oxide (ZTO), copper-indium-oxide (CIO), copper-zinc-oxide (CZO), gallium-zinc-oxide (GZO), aluminum-zinc-oxide (AZO), or carbon nanotubes.

16. The QD-LED of claim 15, wherein said transparent high work function electrode further comprises poly[(9,9-dioctylfluorenyl-2,7-diyl)-co-(4,4-(N-(4-sec-butylphenyl)) diphenylamine)] (TFB), poly(N,N'-bis(4-butylphenyl)-N,N'-bis(phenyl)benzidine) (poly-TPD), or poly-n-vinylcarbazole (PVK).

17. A method of preparing a QD-LED comprising:
   providing an electrode;
   depositing a particulate electron injection and transport layer;
   depositing a light emitting layer comprising a plurality of QDs;
   depositing a hole injection and transport layer; and
   capping said QD-LED with a counter electrode, wherein said steps of depositing comprise a non-reactive fluid deposition method and wherein said electron injection and transport layer consists of ZnO nanoparticles, wherein said ZnO nanoparticles have a diameter less than 5 nm.

18. The method of claim 17, wherein said depositing an electron injection and transport layer comprises spin coating, printing, casting, or spraying a surface of said electrode or said light emitting layer with a suspension of said ZnO nanoparticles and removing a suspending vehicle from said deposited suspension of said ZnO nanoparticles.

19. The method of claim 17, wherein said depositing a hole injection and transport layer comprises spin coating, printing, casting, or spraying a surface of said electrode or said light emitting layer with a suspension of MO-NPs and removing a suspending vehicle from said deposited suspension of MO-NPs.

20. The method of claim 19, wherein said MO-NPs comprise NiO, MoO$_3$, MoS$_2$, Cr$_2$O$_3$ and Bi$_2$O$_3$, p-type ZnO, p-type GaN, or any combination thereof.

21. The method of claim 17, wherein said depositing a hole injection and transport layer comprises spin coating, printing, casting, or spraying a surface of said electrode or said light emitting layer with a solution of one or more inorganic materials and removing a solvent from said deposited solution of inorganic materials.

22. The method of claim 17, wherein said depositing a hole injection and transport layer comprises chemical vapor deposition, sputtering, e-beam evaporation or vacuum deposition.

23. The method of claim 17, wherein each of said depositing steps comprises spin coating, printing, casting, or spraying a solution or suspension and subsequently removing a solvent or suspending vehicle from said deposited solution or suspension.

* * * * *